United States Patent [19]
Van Der Laan et al.

[11] Patent Number: 6,140,823
[45] Date of Patent: Oct. 31, 2000

[54] METHOD AND APPARATUS FOR MEASURING A TRANSFER IMPEDANCE OF SHIELDED DEVICES AND COMMON MODE CURRENTS IN SHIELDINGS

[75] Inventors: Pieter Cornelis Tobias Van Der Laan, Aalst Waalre; Alexander Petrus Johannes Van Deursen, Nuenen; Franciscus Bernardus Marie Van Horck, Eindhoven; Bernardus Lambertus Franciscus Paagman, Schijndel, all of Netherlands

[73] Assignee: Berg Technology, Inc., Reno, Nev.

[21] Appl. No.: 09/133,883

[22] Filed: Aug. 14, 1998

Related U.S. Application Data

[62] Division of application No. 08/622,206, Mar. 27, 1996, Pat. No. 5,825,190.

[30] Foreign Application Priority Data

Mar. 31, 1995 [EP]  European Pat. Off. .............. 95200825

[51] Int. Cl.$^7$ ................................................. G01R 27/28
[52] U.S. Cl. .......................................... 324/627; 324/612
[58] Field of Search ................................. 324/612, 615, 324/627, 629

[56] References Cited

U.S. PATENT DOCUMENTS

| | | | |
|---|---|---|---|
| 3,743,925 | 7/1973 | Bossi | 324/627 |
| 3,839,672 | 10/1974 | Anderson | 324/627 |
| 3,952,245 | 4/1976 | Miller | 324/627 |
| 4,425,542 | 1/1984 | Tsaliovich et al. | 324/627 |
| 4,931,720 | 6/1990 | Garbe et al. | 324/627 |
| 5,378,992 | 1/1995 | Murphy | 324/627 |

*Primary Examiner*—Glenn W. Brown
*Attorney, Agent, or Firm*—Brian J. Hamilla; M. Richard Page

[57] ABSTRACT

A method for measuring a common mode current (Icm) in an outer conductor of a shielded electrical connector comprising also at least one inner conductor which includes the steps of interconnecting the one inner conductor and the outer conductor at a junction point to a power source and supplying a current (Icm) to the junction point draining substantially all common mode current (Icm) from the outer conductor at the opposite side of the connector by means of a low impedance drain; and sensing the drained common mode current (Icm) with a current sensing device.

3 Claims, 2 Drawing Sheets

METHOD AND APPARATUS FOR MEASURING A TRANSFER IMPEDANCE OF SHIELDED DEVICES AND COMMON MODE CURRENTS IN SHIELDINGS

This application is a division of application Ser. No. 08/622,206, filed Mar. 27, 1996, now U.S. Pat. No. 5,825,190.

BACKGROUND OF THE INVENTION

1. Field of the Invention

The present invention relates to a method and apparatus for measuring at least one transfer impedance of shielded devices and common mode currents in shieldings.

2. Brief Description of Prior Developments

Increase in signal speed and guidelines for Electromagnetic Compatibility require methods and apparatus for determination of shielding effectiveness. In IEC TC46/WG5 it was proposed that the transfer impedance be the measure for shielding effectiveness.

Several methods and apparatus for measuring the transfer impedance are known, e.g. the matched triaxial, wire injection and mode-stirred chamber method. However, they are essentially only suitable for shielded cables, require very high investments or are difficult to use.

The primary object of the invention is to provide a transfer impedance measurement method and apparatus for carrying out such a method which are easy to use and do not need any high investment.

Another object of the invention is to provide a method and an apparatus for measuring a common mode current through a shielding system, having any desired form, of a shielded device which method can be used to measure transfer impedances.

A further object of the invention to provide such a method and apparatus which can, for instance, easily be used to measure at least one transfer impedance of connectors for any number of contact members or their position within the connector body.

SUMMARY OF THE INVENTION

Therefore, in accordance with the invention a method for measuring a common mode current in an outer conductor of a device comprising also at least one inner conductor is provided, comprising the steps of:

a. interconnecting said at least one inner conductor and said outer conductor at a junction point at one side of the device;

b. connecting said junction point to a power source and supplying a current to said junction point by means of a power source;

c. draining substantially all common mode current from said outer conductor at the opposite side of the device by means of low impedance drain means;

d. sensing said drained common mode current with a current sensing means.

Moreover, in accordance with the invention a method for measuring a transfer impedance between at least one inner conductor of a device and its outer conductor is provided, comprising the steps of:

a. interconnecting said at least one inner conductor and said outer conductor at a junction point at one side of the device;

b. connecting said junction point to a power source and supplying a current to said junction point by means of a power source;

c. draining substantially all common mode current from said outer conductor at the opposite side of the device by means of low impedance drain means;

d. sensing said drained common mode current with a current sensing means.

e. measuring the differential mode voltage between said selected inner conductor and said outer conductor of said device;

f. calculating the transfer impedance in accordance with the following equation:

$$Zt = Udm/Icm$$

where:

Zt=transfer impedance

Udm=differential mode voltage

Icm=common mode current

The invention also relates to an apparatus for carrying out the method mentioned above for measuring the common mode current in the outer conductor of the device comprising also at least one inner conductor, the apparatus comprising:

a first connector having an inner conductor to be connected to said power source in order to receive said common mode current and to pass said current to the junction point;

low impedance drain means to be connected to the outer conductor of the device and to the current sensing means in order to drain the common mode current from said outer conductor of said device into said current sensing means.

Moreover, the invention relates to an apparatus for carrying out the method mentioned above for measuring the transfer impedance between at least one inner conductor of the device and its outer conductor, comprising:

a first connector having an inner conductor to be connected to said power source in order to receive said common mode current and to pass said current to the junction point;

a second connector having an inner conductor to be connected to the at least one inner conductor and an outer conductor to be connected to the outer conductor of the device;

impedance means arranged to substantially prevent said common mode current from flowing from the outer conductor of device to the outer conductor of said second connector, and low impedance drain means to be connected to the outer conductor of the device and to the current sensing means in order to drain the common mode current from said outer conductor of said device into said current sensing means.

In both of said apparatuses defined above the impedance means may be constituted by a ferrite surrounding the outer conductor of the second connector.

The drain means may be made of a first conductive plate having a predetermined shape and the current sensing means may comprise a second conductive plate and a third connector, the second plate having a predetermined shape and being electrically connected to said first conductive plate, and the third connector having a contact pin connected to said second plate and an outer conductor electrically connected to said second plate at a location remote from said contact pin, the second plate and the third connector being arranged in such a way that they operate like a transformer the output voltage of which is a measure of the common mode current.

The apparatus may be provided with a conductive casing comprising suitable openings accommodating the first connector, the second connector and the current sensing means, said openings being electrically closed in the assembled state.

The invention is also directed to an apparatus as defined above, a current source and a resistor in combination, the current source and the resistor being connected in series to the inner conductor of the first connector.

The device may be a shielded connector or a shielded cable but the invention is not restricted to these devices.

There are several advantages of the method and apparatus according to the invention. First of all, when a multi-contact connector (or a multi-wire cable) is measured none of the contact members (or none of the wires) need be removed in order to make a reliable measurement. Moreover, in shielded connectors under test the current through the shielding is homogeneously divided to an acceptable level, reflections caused by impedance mismatch at the near-end and the far-end of the connector have no significant influence on the results of the measurements due to the common mode measurement apparatus itself. Moreover, the connector under test (or any other device to be tested) can be easily mounted into the measurement arrangement. No measures are needed to measure injection losses to correct measured transfer impedances as in prior art arrangements.

The invention is based on the insight that it is possible to directly measure the differential mode voltage Udm induced by the transfer impedance between any inner conductor and the outer conductor of a connector (or any other shielded device), and the common mode current flowing in the outer conductor.

BRIEF DESCRIPTION OF THE DRAWINGS

The invention will be explained below in detail by reference to the accompanying drawings which are meant to illustrate and not to limit the scope of the invention which are.

DETAILED DESCRIPTION OF THE PREFERRED EMBODIMENTS

Figure 1:
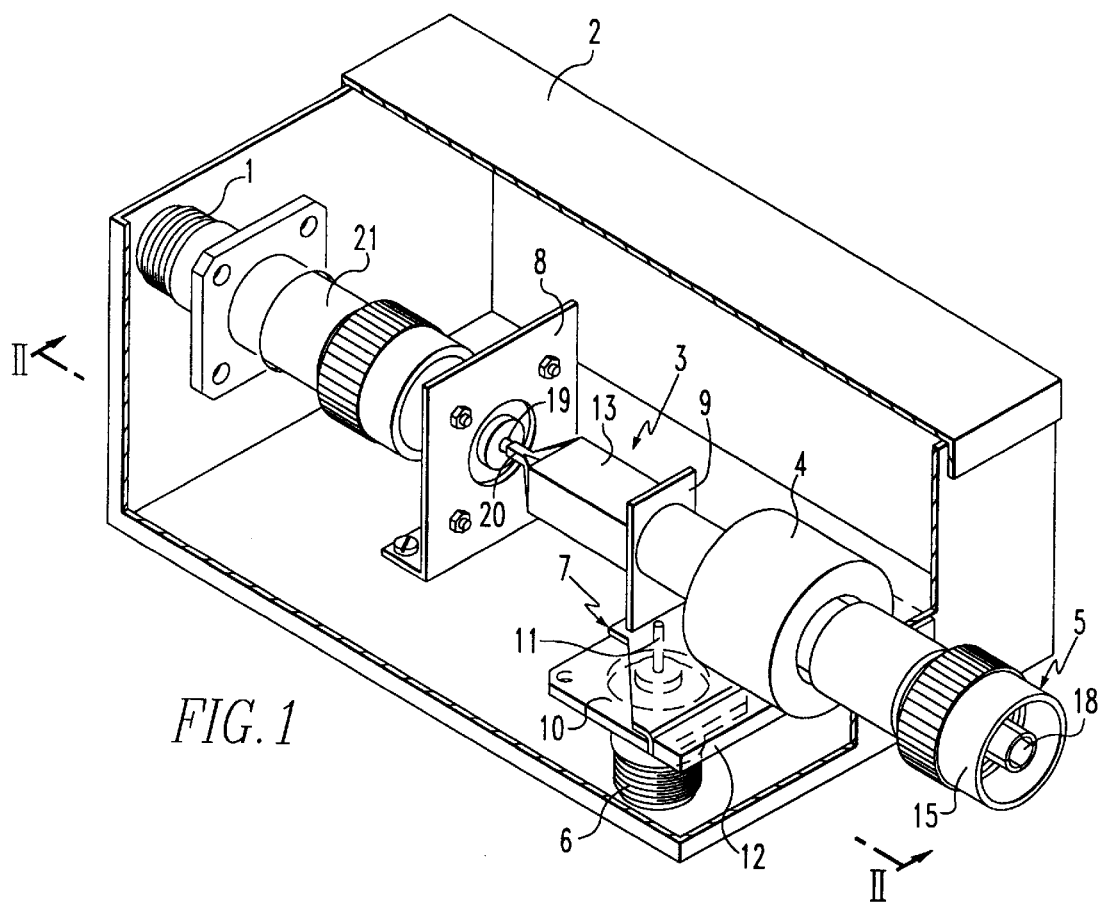
FIG. 1 shows an arrangement partly in exploded view for measuring the common mode current in the shielding of a connector and its transfer impedance.
Figure 3:
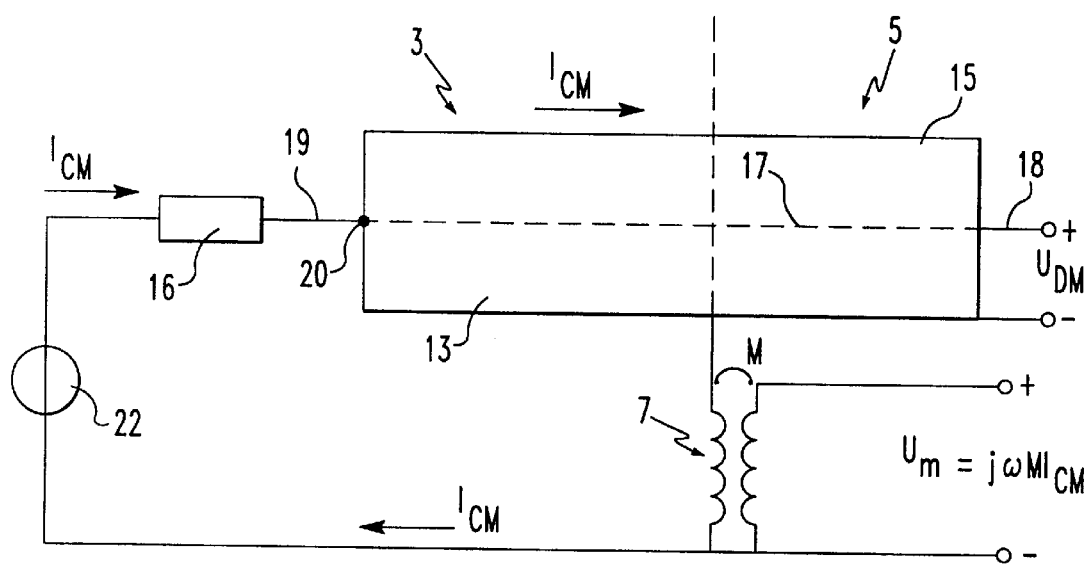
FIG. 3 shows an equivalent electrical circuit of the measurement arrangement according to FIGS. 1 and 2.

FIG. 1 shows an input connector 1 to be connected to a suitable voltage or current source 22 (FIG. 3). The input connector 1 is accommodated in a suitable opening in a conductive casing 2 acting as a shielded chamber to avoid crosstalk between the current input cable (not shown) connected to input connector 1 and output cables (not shown) connected to two output connectors 5 and 6, and to avoid interference from the measurement system to the outer environment. The opening accommodating connector 1 is electrically closed in the assembled state, e.g. by metal foil or in any other suitable way.

Figure 2:
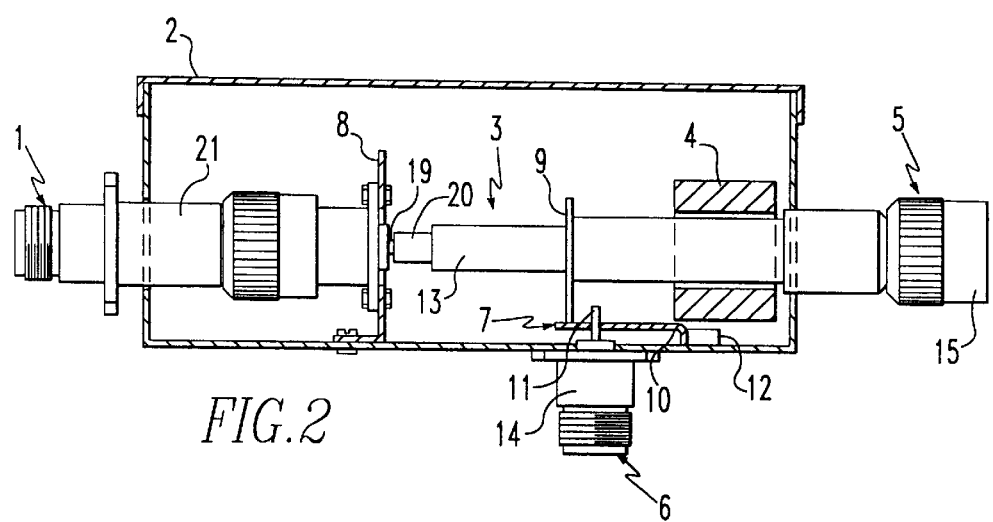
FIG. 2 shows a sectional view of the arrangement according to FIG. 1 along lines II—II.

Connectors 5 and 6 are also accommodated in suitable openings in the casing 2. The openings accommodating connectors 5 and 6 are also electrically closed in the assembled state, e.g. by metal foil or in any other suitable way. Each of the three connectors 1, 5, 6 extend from the casing 2 although this is not necessary for the invention: they may be entirely accommodated within the casing 2 or extend from the casing to a greater extent than is shown in FIGS. 1 and 2. To avoid any interference with the environment, each of the openings accommodating connectors 1, 5, 6 need be electrically closed for whatever design is chosen.

Connector 1 is supported by conducting supporting means 8 within the casing 2. The supporting means 8 electrically contact the outer conductor 21 of connector 1 in order to provide a common ground.

Inner conductor 19 (FIGS. 2, 3) of connector 1 is, in use, connected at junction point 20 to outer conductor 13 of a connector 3 the transfer impedance of which is to be determined. One end of an inner conductor 17 of connector 3 is also connected to junction point 20 and the other end of inner conductor 17 is connected to inner conductor 18 of connector 5 (FIG. 3). Preferably, at junction point 20 outer conductor 13 of connector 3 is connected to inner conductor 17 in an entirely circumferentially closed way.

The outer conductor 13 of connector 3 electrically contacts outer conductor 15 of connector 5. Outer conductor 15 of connector 5 is surrounded by a ferrite 4 the function of which will be explained hereinafter.

At the junction between outer conductor 13 and outer conductor 15 a first conductive plate 9 is provided which may be made of copper but any other conductive metal is also suitable. Plate 9 has a predetermined shape, e.g. a rectangular shape as shown in FIG. 1 and a through hole (not shown) for receiving and contacting the outer conductor 15 of connector 5. Preferably, plate 9 substantially entirely contacts the side face of connector 3 in order to collect the common mode current IcM as symmetrical as possible and to form a low impedance drain means. The lower side of plate 9, as shown in FIGS. 1 and 2, is electrically and mechanically connected to a second conductive plate 10 of predetermined shape. Plate 10 is provided with a hole accommodating a contact pin 11 of connector 6. Contact pin 11 is electrically connected to plate 10, e.g. by soldering. Plate 10 is supported by suitable supporting means 12 connected to casing 2. The supporting means 12 is remote from the location where contact pin 11 is connected to the second plate 10. Through supporting means 12 plate 10 is in electrical contact with casing 2. Outer conductor 14 of connector 6 is electrically and mechanically connected to casing 2.

The special configuration of the second plate 10 and its connection to connector 6 is electrically equivalent to a transformer, designated by reference number 7. Transformer 7 can be conceived of as an inductive sensor of the common mode current in outer conductor 13 of connector 3 under test as will be explained below by reference to FIG. 3.

FIG. 3 shows an equivalent electrical circuit of the arrangement according to FIGS. 1 and 2. The outer conductor 21 of connector 1 has been omitted from FIG. 3 since it is not essential for understanding the present invention. Inner conductor 19 of connector 1 is connected to current source 22 through a resistor 16 which may, for instance, be 50 Ω. In operation, current source 22 generates current Icm, i.e. a common mode current for the arrangement shown. Current Icm flows through the inner conductor 19 of connector 1 and junction point 20 to the outer conductor 13 of connector 3 the transfer impedance Zt of which is to be determined by the apparatus and method described. Current Icm flows through the outer conductor 13 of connector 3 in the direction of first plate 9. Ferrite 4 is designed to be a very high impedance for any current, within a preselected frequency range, to the outer conductor 15 of connector 5. Therefore, Icm is prevented from flowing on the outer conductor 15 of connector 5, even when a measuring device (not shown) with an input impedance of e.g. 50 Ω is connected between inner conductor 18 and outer conductor 15 of connector 5, and substantially only flows through first plate 9 and second plate 10 to casing 2, and then back to current source 22. Ferrite 4 is designed to prevent any leak from common current Icm to the outer conductor 15 of connector 5.

Because of the coupling due to the transfer impedance Zt between the inner conductor 17 and outer conductor 13 of connector 3 a differential mode voltage Udm is induced between these conductors 13, 17. Since ferrite 4 substantially prevents the common mode current Icm from flowing to outer conductor 15 of connector 5 only this differential mode voltage Udm will be present between the inner conductor 18 and outer conductor 15 of connector 5. The value of transfer impedance Zt follows from:

$$Zt = Udm/Icm \quad (1)$$

Special inductive sensor 7 is provided to measure the common mode current Icm. FIG. 3 shows a transformer 7 which is the electrical equivalent of sensor 7 constituted by second plate 10 and connector 6 in combination. The output voltage Um of transformer 7 equals:

$$Um = j\omega M^* Icm \quad (2)$$

where M=mutual inductance of sensor 7.
From equation (1) and (2) it follows that $$Zt = j\omega M^* Udm/Um \quad (3)$$

Since M has a predetermined value and both Udm and Um can be measured by well known measuring techniques transfer impedance Zt can be easily determined by the arrangement shown.

To measure the transfer impedance between an inner conductor 17 and outer conductor 13 of connector 3 inner conductor 17 need not be placed in a predetermined relation to outer conductor 13 as is necessary in many transfer impedance methods according to the prior art. Inner conductor 17 remains in its original position within the connector 3.

Moreover, the method and apparatus can be easily used to measure transfer impedances of multi-contact connectors (or multi-wire cables). To measure the individual transfer impedance of each of the contact members of a multi-contact connector they can be successively connected, one after the other, to the junction point 20. In order to measure the transfer impedance between any inner conductor and outer conductor 13 none of the other inner conductors need be removed from the connector before the measurement.

The advantages of the arrangement according FIGS. 1 and 2 are: the current through the outer conductor of connector 3 under test is homogeneously divided to an acceptable level, reflections caused by impedance mismatch at the near-end and the far-end of connector 3 under test have no significant influence on the results of the measurements due to the common mode behavior of the connectors 1, 5, 6 used in the measurement arrangement. Moreover, connector 3 under test can be easily mounted into the measurement arrangement. No measures are needed to measure injection losses to correct measured transfer impedances as in prior art arrangements.

The invention is based on the insight that it is possible to directly measure the differential mode voltage Udm induced by the transfer impedance Zt between any inner conductor and the outer conductor of a connector (or any other shielded device), and the common mode current Icm flowing in the outer conductor. The arrangement and the method to measure the common mode current in the outer conductor 13 is not restricted to shielded connectors but is also applicable for any other shielded device such as shielded cables.

It is to be understood that ferrite 4 is a suitable arrangement for preventing the common mode current Icm on the outer conductor 13 of connector 3 from flowing into outer conductor 15 of connector 5. However, the invention is not restricted to the application of a ferrite 4. Any other suitable impedance means showing a very high impedance for the frequency of Icm concerned may be used to direct the common mode current substantially into first plate 9.

Moreover, first plate 9 may be substituted by any other suitable low impedance means to drain the common current Icm from outer conductor 13 of connector 3 to sensor 7.

Sensor 7 is shown to be made by a suitable configuration of a connector 6 and second plate 10. However, other current sensors are conceivable, the only requirement being that the sensor used does not substantially affect the common mode current Icm to be measured.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for measuring a common mode current (Icm) in an outer conductor of a shielded electrical connector comprising also at least one inner conductor, comprising the steps of:
   (a) interconnecting said at least one inner conductor and said outer conductor at a junction point at one side of the device;
   (b) connecting said junction point to a power source and supplying a current (Icm) to said junction point by means of the power source;
   (c) draining substantially all common mode current (Icm) from said outer conductor at the opposite side of the device by means of low impedance drain means; and
   (d) sensing said drained common mode current (Icm) with a current sensing means.

2. A method for measuring a transfer impedance (Zt) between at least one inner conductor of a shielded electrical connector and its outer conductor, comprising the steps of:
   (a) interconnecting said at least one inner conductor and said outer conductor at a junction point at one side of the device;
   (b) connecting said junction point to a power source and supplying a current (Icm) to said junction point by means of the power source;
   (c) draining substantially all common mode current (Icm) from said outer conductor at the opposite side of the device by means of low impedance drain means;
   (d) sensing said drained common mode current (Icm) with a current sensing means;
   (e) measuring the differential mode voltage (Udm) between said selected inner conductor and said outer conductor of said device; and
   (f). calculating the transfer impedance (Zt) in accordance with the following equation:

$$Zt = Udm/Icm$$

where:

Zt=transfer impedance

Udm=differential mode voltage

Icm=common mode current.

3. An apparatus for measuring the common mode current (Icm) in an outer conductor of a shielded electrical connector comprising also at least one inner conductor, the apparatus comprising:

a first connector having an inner conductor to be connected to a power source in order to receive said common mode current (Icm) and to pass said current (Icm) to a junction point such that the power source and a resistor are connected in series to the inner conductor of the first connector;

low impedance drain means to be connected to the outer conductor of the device and to a current sensing means in order to drain the common mode current (Icm) from said outer conductor of said device into said current sensing means;

impedance means comprising a ferrite surrounding the outer conductor of the second connector arranged to substantially prevent said common mode current (Icm) from flowing from the outer conductor of the device to the outer conductor of said second connector;

low impedance drain means to be connected to the outer conductor of the device and to a current sensing means in order to drain the common mode current (Icm) from said outer conductor of said device into said current sensing means and the drain means are made of a first conductive plate having a predetermined shape and a current sensing means comprises a second conductive plate and a third connector, the second plate having a predetermined shape and being electrically connected to said first conductive plate, and the third connector having a contact pin connected to said second plate and an outer conductor electrically connected to said second plate at a location remote from said contact pin, the second plate and the third connector being arranged in such a way as to transform output voltage;

a conductive casing comprising openings accommodating the first connector, the second connector and the current sensing means, said opening being electrically closed in the assembled state;

a current source and a resistor in combination, the current source and the resistor being connected in series to the inner conductor of the first connector.

* * * * *